United States Patent

Olney, Jr.

[15] 3,701,838

[45] *Oct. 31, 1972

[54] CIRCUIT BOARD

[72] Inventor: Frederick D. Olney, Jr., Phoenix, Ariz.

[73] Assignee: Honeywell Information Systems Inc.

[ * ] Notice: The portion of the term of this patent subsequent to Feb. 29, 1989, has been disclaimed.

[22] Filed: June 29, 1970

[21] Appl. No.: 50,508

[52] U.S. Cl. ......................174/68.5, 29/625, 29/626, 317/101 CC, 339/17 G

[51] Int. Cl. ................................................H05k 3/32

[58] Field of Search .........124/68.5, 72 A; 317/101 B, 317/101 C, 101 CC, 101 CM, 120; 339/17; 29/625–628

[56] References Cited

UNITED STATES PATENTS 3,506,879 4/1970 Maxwell et al. ......317/101 CC

*Primary Examiner*—Darrell L. Clay
*Attorney*—Edward W. Hughes, Herbert E. Haynes, Jr., H. Gordon Shields, James A. Pershon, Frank L. Neuhauser, Oscar B. Waddell and Joseph B. Forman

[57] ABSTRACT

A circuit board having conductors sewn therein to electrically connect selected conductive areas is provided with apertured electrically-isolated areas into which the conductors are sewn for controlled routing of the conductors.

6 Claims, 3 Drawing Figures

INVENTOR.
FREDERICK D. OLNEY JR.
BY Herbert E. Haynes Jr.
AGENT

CIRCUIT BOARD

BACKGROUND OF THE INVENTION

1. Field of the Invention

This invention relates to circuit boards and more particularly to controlled routing and positioning of conductors thereon.

2. Prior Art

In the circuit board art electrical elements such as resistors, capacitors, transistors, integrated circuits, and the like, are mounted and electrically connected to conductive areas on the circuit board. There are various well-known techniques for accomplishing the mounting of these elements, such as soldering the element leads within apertures formed in the conductive areas.

A method for conducting electrical signals to elements mounted on circuit boards in disclosed in copending U.S. Pat. Application, Ser. No. 39,728, filed May 22, 1970, by the same inventor, and assigned to the same assignee. That method, briefly described, comprises the sewing of insulated conductors into apertures formed in solder coated conductive areas of a circuit board. A conductor is sequentially sewn into a predetermined series of apertured conductive areas to form a discrete signal path. The conductor is then cut and another signal path is then sewn. The sewing and cutting continues until all the desired connectors are installed. Heat is then applied to the conductive areas to melt the insulation and to reflow the solder to form electrical connections between the conductive areas and the conductors sewn therein. The insulation of electrical elements are then inserted into the desired apertures and then the circuit board is flow soldered to electrically connect the leads within the apertures.

The sewing of conductors in the above described manner results in a random conductor routing, determined only by the need to connect one conductive area with another. Random conductor routing is acceptable for low frequency applications, but conductor placement can be critical in high frequency equipment due to crosstalk. Crosstalk is defined as signal erosion and noise which occurs when a magnetic field, caused by current flowing through a conductor, induces a current flow in an adjacent conductor.

Another problem associated with random conductor placement is that when a large number of conductors are installed on a circuit board, the conductors cross over conductive areas and could be erroneously connected thereto when heat is applied to the conductive area as hereinbefore described.

Therefore, the need exists for a method of controlling the routing of conductors which are sewn into a circuit board.

SUMMARY OF THE INVENTION

In accordance with the invention claimed, a new and useful circuit board which provides means for controlling conductor routing thereon is disclosed.

The circuit board of the present invention comprises a plurality of apertured electrically isolated areas into which insulated conductors are sewn. The electrically isolated areas are arranged in a predetermined array so that the conductors may be sewn into them for routing purposes.

The briefly described circuit board of this invention overcomes the problems of crosstalk and of conductors crossing over conductive areas by providing means for controlling conductor placement.

Accordingly, it is an object of this invention to provide a new and useful circuit board.

Another object of this invention is to provide a new circuit board having means for controlling conductor placement thereon.

Another object of this invention is to provide a new and useful circuit board having apertured electrically isolated areas thereon in which conductors are sewn for controlling the routing thereof.

The foregoing and other objects of this invention, the various features thereof, as well as the invention itself, may be more fully understood from the following description when read in conjunction with the accompanying drawings.

DESCRIPTION OF THE PREFERRED EMBODIMENT

Figures 1, 2, 3:
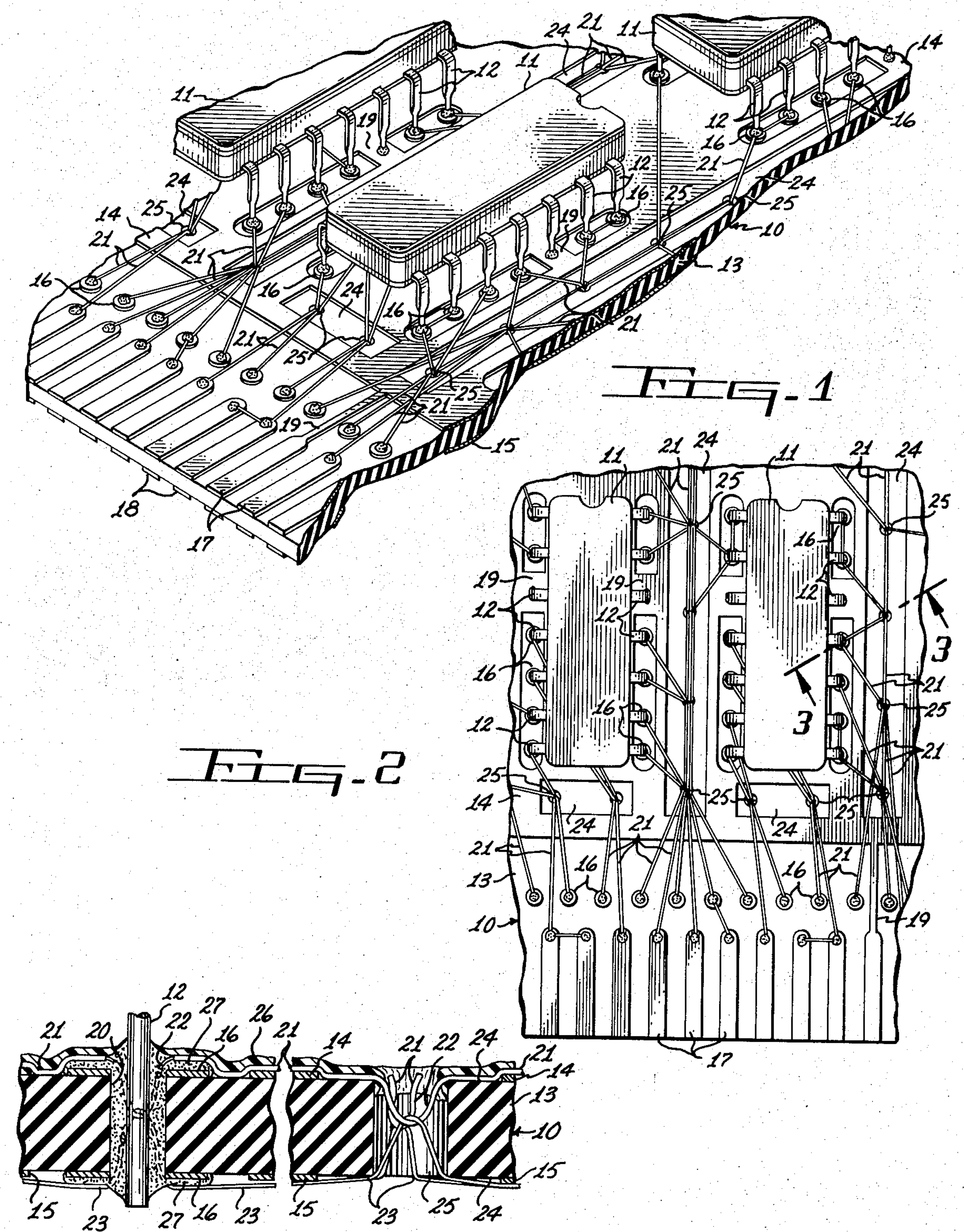
FIG. 1 is a fragmentary perspective view illustrating a circuit board incorporating the features of this invention.
FIG. 2 is a plan view of the circuit board.
FIG. 3 is a sectional view taken on the line 3—3 of FIG. 2.

Referring more particularly to the drawings, FIGS. 1 and 2 illustrate a fragmentary portion of a circuit board 10 having electrical elements 11 mounted thereon. The electrical elements shown are dual-in-line integrated circuit packages having a plurality of leads 12 extending therefrom. The particular type of circuit board and electrical elements shown were chosen for illustrative purposes only. The hereinafter described invention may be applied to any type of circuit board, and is not affected by the type of electrical element.

The circuit board 10 comprises a substrate 13 of insulative material, such as epoxy glass. Printed circuits 14 and 15, pads 16, edge contacts 17 and 18, and runs 19 are all fabricated by printed circuit technology which is well known in the art. The pads 16, or conductive areas, have apertures 20 formed therein (FIG. 3) which may be provided with metalized bores (not shown) commonly referred to as plated through holes. Besides forming the conductive areas 16 by utilizing the printed circuit technology, they may be formed by other methods such as pressing a bushing of conductive material (not shown) into a hole formed in the substrate.

Insulated conductors 21 are installed and electrically connected to the conductive areas 16 by a method which will be only briefly described. The method is fully disclosed in the hereinbefore referenced patent application.

Conductors 21 are sequentially strung from one conductive area 16 to another, and sewn into each area by a modified sewing machine (not shown). The sewing machine forms a loop 22 (FIG. 3) in the conductor 21 within each aperture 20 and each loop is engaged by a thread 23 to retain the conductor within the apertures. When all the conductive areas to which electrical connection is to be made have had the conductors sewn therein, heat is applied in an appropriate manner to the conductive areas which melts the insulation on the conductors in the area of the loop. The heat also reflows solder 27, which was plated or otherwise applied to conductive areas 16 during board fabrication, and secures the conductors 21 to conductive areas 16. The solder 27 is applied to the conductive areas in a relatively thin layer which results in the aperture 20 remaining open even after the reflowing. Therefore, apertures 20 may then have leads 12 of elements 11 inserted therein. The circuit board 10 may then be flow-soldered, in accordance with techniques well known in the art, to secure and electrically connect leads 12, conductors 21, and conductive areas 16.

The circuit board 10 of this invention is provided with a plurality of electrically isolated areas 24 having apertures 25 drilled or otherwise formed therein. The electrically isolated areas 24 are defined as areas which need not be electrically connected to any circuitry or elements provided on the board, because their main purpose is for conductor routing. As seen in FIGS. 1 and 2, the isolated areas 24 may be provided between parallel rows of conductive areas 16, or elsewhere, so that the conductors 21 may be sewn therein to allow the direction of the conductors to be changed between sequentially sewn conductive areas 16. This changing of direction permits exact placement of the conductors to avoid the problems of crosstalk and of conductors crossing over conductive areas 16.

The electrically isolated area 24 and its associated aperture 25, as shown in FIG. 3, contains no conductive material because the aperture is formed in the insulative material of substrate 13. Therefore, conductors 21 which are sewn into isolated areas 24 of this type are retained therein by thread 23. If it is desired to provide additional means for holding the conductors in place, a coating of curable insulative material 26, such as polyurethane or epoxy may be applied. Coating 26, when cured, acts as a fixative to mechanically bond the conductors to the board and also serves as a protective barrier.

If a particular circuit board is designed so that electrically isolated areas 24 only have one conductor sewn therein, or the same conductor sewn therein several times, conductive material may be formed in the isolated areas. Conductors 21 may then be soldered in place as hereinbefore described for conductive areas 16.

Since it is not intended that leads 12 of elements 11 be installed in the electrically isolated areas 24, the apertures 25 may be of any convenient diameter. Therefore, as many conductors 21 may be sewn into a particular isolated area as the design of the board requires.

In some applications it may be desirable to utilize the electrically isolated areas 24 as junction points. That is, electrically connect one or more of the conductors 21 to other conductors sewn into the same electrically isolated area. To accomplish the junctioning feature, a multi-conductor system is employed. The multi-conductor system comprises the sewing of discrete circuits with some conductors having one type of insulative material thereon, and other discrete circuits with conductors having other types of insulative material. For example, some conductors may have a nylon dielectric material which melts at approximately 420° F, and other conductors may have a polyurethane dielectric which melts at approximately 680° F. Therefore, applying heat in the range of 420° F to an electrically isolated area having solder tinned conductive material formed thereon and the multi-conductors described above sewn therein, will melt the nylon dielectric and reflow the solder to join the nylon insulated conductors and will not disturb the polyurethane insulated conductors.

Several types of thread may be used for holding the conductors in place. If it is desired to remove the thread after the circuit board is complete, as is possible in the instances when a curable fixative is used or when the conductors are soldered, any inexpensive commercially available thread, such as thread having a polyester base, may be used. Such type of thread will usually withstand the temperatures of flow-soldering in excess of 500° F for the short periods of time normally associated with these joining processes and may easily be removed when desired. When the thread is to be left on the board a more expensive thread may be used which withstands higher temperatures and is fire retardant. One such latter type thread is obtainable from DuPont de Nemours and Co., Inc. and is marketed under the tradename Nomex.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A circuit board comprising:

a. a substrate supporting electrical circuitry;

b. apertured conductive areas formed on said substrate;

c. a conductor sewn into selected ones of said apertured conductive areas and electrically connected thereto for conducting electrical signals in conjunction with the electrical circuitry;

d. routing means provided on said substrate for receiving said conductor for controlling the positioning thereof; and e. a thread holding said conductor into selected ones of said apertured conductive areas controlling the positioning of said conductor on said substrate.

2. A circuit board as claimed in claim 1 wherein said routing means comprises electrically isolated areas having apertures formed therein into which said conductor is sewn.

3. A circuit board comprising:

a. a substrate supporting electrical circuitry;

b. apertured conductive areas formed on said substrate;

c. a conductor sewn into selected ones of said apertured conductive areas and electrically connected thereto for conducting electrical signals in conjunction with the electrical circuitry;

d. apertured electrically isolated areas formed on said substrate into which said conductor is looped; and e. a thread looped over the loop of said conductor retaining said conductor within said apertured electrically isolated areas thereby controlling the positioning of said conductor on said substrate.

4. A circuit board comprising:

a. a substrate supporting electrical circuitry;

b. apertured conductive areas supported on said substrate;

c. apertured electrically isolated areas formed in said substrate;

d. a conductor sewn into selected ones of said apertured conductive areas and electrically connected thereto for conducting electrical signals in conjunction with the electrical circuitry, said conductor also sewn into selected ones of said apertured electrically isolated areas; and e. a thread sewn into selected ones of said apertured conductive areas having said conductor sewn therein, retaining said conductor within said apertured conductive areas and said apertured electrically isolated areas, thereby controlling routing of said conductor.

5. In a circuit board of the type having apertured conductive areas formed thereon for connecting electrical elements thereto, and including insulated conductors sewn into and electrically connected to the apertured conductive areas for conducting electric signals therebetween, the improvement comprising apertured electrically isolated areas provided in the circuit board in a predetermined array into which said insulated conductors are sewn and a thread sewn into the apertured conductive areas and apertured electrically isolated areas retaining said conductor within said apertured conductive areas and said apertured electrically isolated areas thereby routing and positioning said insulated conductor.

6. A circuit board for supporting electrical circuitry comprising:

a. a substrate having apertured conductive areas and apertured electrically isolated areas formed thereon;

b. an insulated conductor supported on said substrate conducting electrical signals in conjunction with the electrical circuitry;

c. non-insulated loops formed in said insulated conductor, each of said non-insulated loops inserted into one of the apertured conductive areas and electrically connected thereto;

d. at least one insulated loop formed in said insulated conductor, said insulated loop inserted into one of the apertured electrically isolated areas; and e. a thread looped over the non-insulated and insulated loops of said insulated conductor retaining said insulated conductor within said apertured conductive areas and said apertured electrically isolated areas to provide routing and positioning of said insulated conductor.

* * * * *